(12) United States Patent
Oh et al.

(10) Patent No.: US 10,453,910 B2
(45) Date of Patent: Oct. 22, 2019

(54) DISPLAY APPARATUS

(71) Applicant: Samsung Display Co., Ltd., Yongin-si, Gyeonggi-do (KR)

(72) Inventors: Hyunuk Oh, Yongin-si (KR); Younggu Kim, Yongin-si (KR); Eunjung Oh, Yongin-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/646,801

(22) Filed: Jul. 11, 2017

(65) Prior Publication Data
US 2018/0026088 A1 Jan. 25, 2018

(30) Foreign Application Priority Data
Jul. 20, 2016 (KR) .................. 10-2016-0091992

(51) Int. Cl.
*H01L 27/32* (2006.01)
*H01L 21/66* (2006.01)
(Continued)

(52) U.S. Cl.
CPC .......... *H01L 27/3276* (2013.01); *H01L 22/32* (2013.01); *H05K 1/028* (2013.01); *H05K 1/111* (2013.01); *H01L 27/124* (2013.01); *H01L 27/1218* (2013.01); *H01L 27/1262* (2013.01); *H01L 51/0097* (2013.01); *H01L 51/56* (2013.01); *H01L 2227/323* (2013.01); *H01L 2251/5338* (2013.01); *H05K 1/0268* (2013.01); *H05K 2201/0338* (2013.01); *H05K 2201/10128* (2013.01); *Y02P 70/611* (2015.11)

(58) Field of Classification Search
CPC ...... H01L 27/3276; H01L 22/32; H05K 1/028
See application file for complete search history.

(56) References Cited

U.S. PATENT DOCUMENTS 9,570,365 B2 * 2/2017 Chen ................. H01L 22/32
2011/0043465 A1 * 2/2011 Huang ................. G06F 3/045
345/173

(Continued)

FOREIGN PATENT DOCUMENTS

JP 2003-5205 A 1/2003
KR 10-2010-0098922 A 9/2010
(Continued)

*Primary Examiner* — William H. Mayo, III
*Assistant Examiner* — Hiram E Gonzalez
(74) *Attorney, Agent, or Firm* — Innovation Counsel LLP

(57) ABSTRACT

A display apparatus may include a substrate, a component, a connection wire, a first conductive wire, and a second conductive wire. The substrate may include a first portion, a second portion, and a bent portion. The first portion may be connected through the bent portion to the second portion. The component may be positioned on at least one of the first portion and the bent portion. The connection wire may be positioned on at least the bent portion and electrically connected to the component. The first conductive wire may be formed of a first material and may end at an edge of the substrate. The second conductive wire may be formed of the first material, may be aligned with and electrically insulated from the first conductive wire, and may be electrically connected to the connection wire.

20 Claims, 12 Drawing Sheets

(51) Int. Cl.
*H05K 1/11* (2006.01)
*H05K 1/02* (2006.01)
*H01L 27/12* (2006.01)
*H01L 51/00* (2006.01)
*H01L 51/56* (2006.01)

(56) References Cited

U.S. PATENT DOCUMENTS

2014/0254111 A1* 9/2014 Yamazaki .......... H01L 51/0097
   361/749
2015/0232369 A1 8/2015 Marjanovic et al.
2016/0064364 A1 3/2016 Shin et al.

FOREIGN PATENT DOCUMENTS

KR 10-2013-0142048 A 12/2013
KR 10-2016-0026340 A 3/2016

* cited by examiner

FIG. 13A
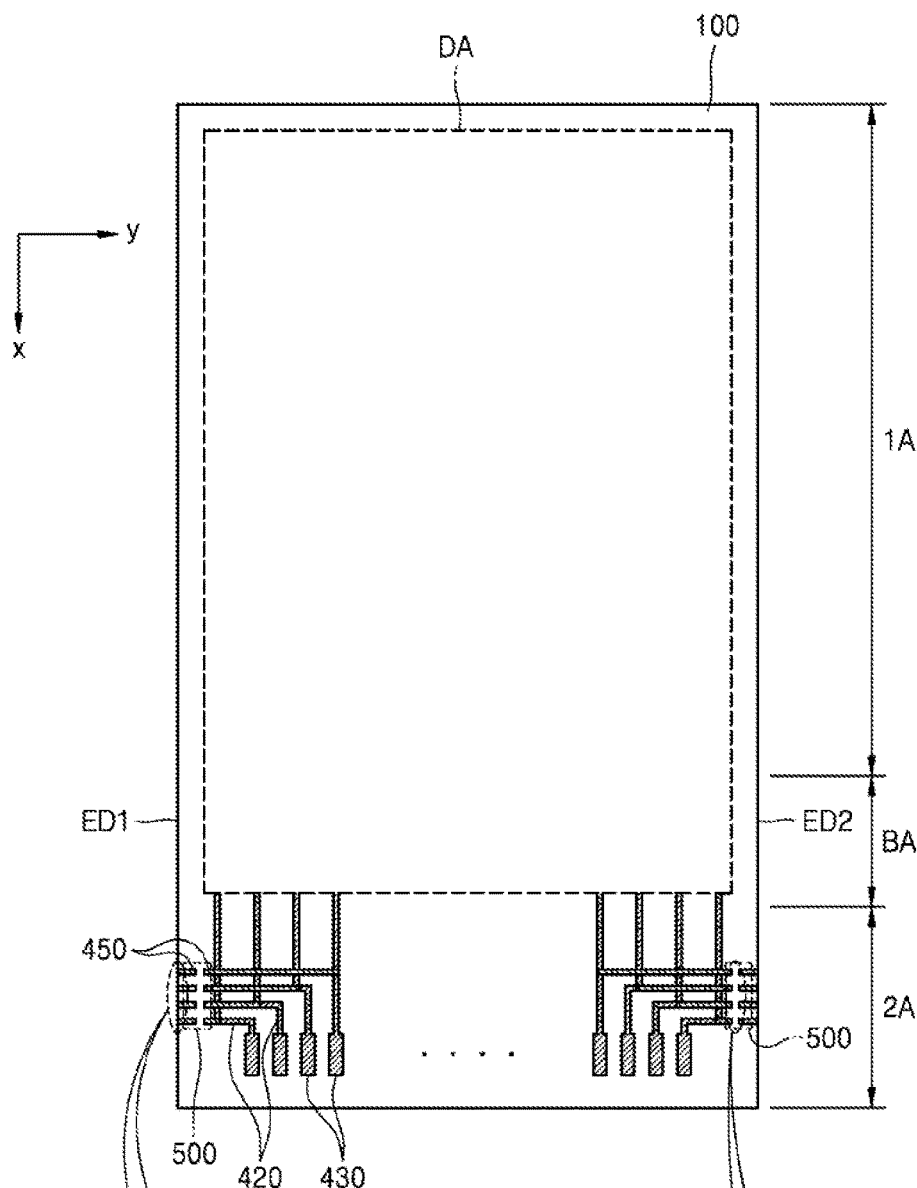
FIG. 13B
FIG. 13C
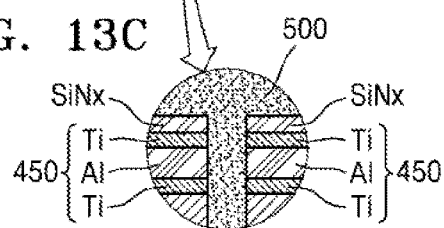

DISPLAY APPARATUS

CROSS-REFERENCE TO RELATED APPLICATION

This application claims the benefit of Korean Patent Application No. 10-2016-0091992, filed on Jul. 20, 2016, in the Korean Intellectual Property Office; the disclosure of the Korean Patent Application is incorporated herein in its entirety by reference.

BACKGROUND

1. Field

The technical field is related to a display apparatus.

2. Description of the Related Art

A display apparatus, e.g., an organic light-emitting diode (OLED) display device or a liquid crystal display (LCD) device, may include a one or more components for controlling emission, transmission, and/or reflection of light. The display apparatus may include a connection wire electrically connected to the one or more components. If the connection wire receives unintended input (e.g., static electricity) and/or is damaged, performance of the display apparatus may be unsatisfactory, and/or the lifespan of the display apparatus may be shortened.

SUMMARY

One or more embodiments may be related to a display apparatus in which potential defect may be prevented.

According to one or more embodiments, a display apparatus includes the following elements: a substrate comprising a first area, a second area, and a bent area between the first area and the second area, the substrate being bent with respect to a bending axis in the bent area so that a rear surface of the second area faces at least part of a rear surface of the first area; a display portion located at least in the first area; a pad located in the second area; a connection wire electrically connected to the pad and extending to at least one of the first area and the bent area; and a test wire located in the second area and electrically connected to one of the connection wire and the pad, the test wire extending to an end surface of an edge of the substrate and having a discontinued portion.

An end surface of an end portion of the test wire may be flush with the end surface of the edge of the substrate.

The edge of the substrate may extend in a direction crossing the bending axis.

The test wire may be electrically connected to the connection wire.

The edge of the substrate may extend in a direction parallel to the bending axis.

The test wire may be electrically connected to the pad.

In a width of the substrate in a direction parallel to the bending axis, the second area may have a narrow portion having a second width of the substrate that is narrower than a first width of the substrate in the first area.

The edge of the substrate may be located in the narrow portion and may extend in a direction crossing the bending axis.

An end surface of an end portion of the test wire may be flush with the end surface of the edge of the substrate.

The test wire may be electrically connected to the connection wire.

In a width of the substrate in a direction parallel to the bending axis, the bent area and the second area may have a narrow portion having a second width of the substrate that is narrower than a first width of the substrate in the first area.

The edge of the substrate may be located in the narrow portion and may extend in a direction crossing the bending axis.

An end surface of an end portion of the test wire may be flush with the end surface of the edge of the substrate.

The test wire may be electrically connected to the connection wire.

The edge of the substrate may be located in the narrow portion and may extend in a direction parallel to the bending axis.

An end surface of an end portion of the test wire may be flush with the end surface of the edge of the substrate.

The test wire may be electrically connected to the pad.

The display apparatus may further include an insulating layer that covers an inner side surface of the discontinued portion of the test wire.

The insulating layer may cover at least the bent area of the substrate.

The display apparatus may further include an insulating layer that is located under the test wire and has at least one of a through-hole and a groove corresponding to the discontinued portion of the test wire.

An embodiment may be related to a display apparatus. The display apparatus may include a substrate, a component, a connection wire, a first conductive wire, and a second conductive wire. The substrate may include a first portion, a second portion, and a bent portion. The first portion may be connected through the bent portion to the second portion. The component (e.g., a display element, a transistor, and/or a shift register) may be positioned on at least one of the first portion and the bent portion. The connection wire may be positioned on at least the bent portion and electrically connected to the component. The first conductive wire may be formed of a first material and may end at an edge of the substrate. The second conductive wire may be formed of the first material, may be aligned with and electrically insulated from the first conductive wire, and may be electrically connected to the connection wire. The first conductive wire and the second conductive wire may be two remaining section of a test wire after partial removal of the test wire; therefore, a cross section of the first conductive wire (perpendicular to the first conductive wire) may be substantially identical to a cross section of the second conductive wire (perpendicular to the second conductive wire). The features can be appreciated from, for example, one or more of FIG. 1, FIG. 2, FIG. 4A, FIG. 4B, FIG. 4C, FIG. 6, FIG. 7A, FIG. 7B, FIG. 7C, FIG. 9, FIG. 10, FIG. 11, FIG. 12, FIG. 13A, FIG. 13B, and FIG. 13C and related description.

The bent portion may be bent. The first portion may be positioned over the second portion. Both the first conductive wire and the second conductive wire may be positioned on the second portion. The features can be appreciated from, for example, one or more of FIG. 4A, FIG. 4B, FIG. 4C, FIG. 6, FIG. 7A, FIG. 7B, FIG. 7C, FIG. 9, FIG. 10, FIG. 11, FIG. 12, FIG. 13A, FIG. 13B, and FIG. 13C and related description.

The display apparatus may include an insulating layer, which may overlap (and positioned on/over) a surface of the substrate. A portion of the insulating layer may be positioned between an end surface of the first conductive wire and an end surface of the second conductive wire and may directly contact both the end surface of the first conductive wire and the end surface of the second conductive wire. Each of the end surface of the first conductive wire and the end surface of the second conductive wire may not be parallel to the surface of the substrate. Each of the end surface of the first conductive wire and the end surface of the second conductive wire may be perpendicular to the surface of the substrate or may be at an acute angle with respect to the surface of the substrate. A shape of the end surface of the first conductive wire may be substantially a mirror image of a shape of the end surface of the second conductive wire. A size of the end surface of the first conductive wire may be substantially equal to a size of the end surface of the second conductive wire. The features can be appreciated from, for example, one or more of FIG. 4A, FIG. 4B, FIG. 4C, FIG. 7A, FIG. 7B, FIG. 7C, FIG. 13A, FIG. 13B, and FIG. 13C and related description.

The portion of the insulating layer may protrude (and/or extend) perpendicular to the surface of the substrate. The features can be appreciated from, for example, one or more of FIG. 4A, FIG. 4B, FIG. 4C, FIG. 7A, FIG. 7B, FIG. 7C, FIG. 13A, FIG. 13B, and FIG. 13C and related description.

The insulating layer may overlap (and/or may directly contact) each of the connection wire, the first conductive wire, and the second conductive wire. The features can be appreciated from, for example, one or more of FIG. 4A, FIG. 4B, FIG. 4C, FIG. 9, and FIG. 11 and related description.

A first edge of the insulating layer may intersect the first conductive wire (in a plan view of the display apparatus with the bent portion being flat or bent). The features can be appreciated from, for example, one or more of FIG. 4A, FIG. 4B, FIG. 4C, FIG. 7A, FIG. 7B, FIG. 7C, FIG. 9, FIG. 11, FIG. 12, FIG. 13A, FIG. 13B, and FIG. 13C and related description.

A second edge of the insulating layer may intersect the second conductive wire (in the plan view of the display apparatus with the bent portion being flat or bent). The features can be appreciated from, for example, one or more of FIG. 7A, FIG. 7B, FIG. 7C, FIG. 12, FIG. 13A, FIG. 13B, and FIG. 13C and related description.

The first edge of the insulating layer and the second edge of the insulating layer may be positioned between the edge of the substrate and the connection wire (in the plan view of the display apparatus with the bent portion being flat or bent). The features can be appreciated from, for example, one or more of FIG. 7A, FIG. 7B, FIG. 7C, FIG. 12, FIG. 13A, FIG. 13B, and FIG. 13C and related description.

The display apparatus may include a pad. The second conductive wire may be electrically connected through the pad to the connection wire. The first edge of the insulating layer and the second edge of the insulating layer may be positioned between the edge of the substrate and the pad (in the plan view of the display apparatus with the bent portion being flat or bent). The features can be appreciated from, for example, one or more of FIG. 7A, FIG. 7B, FIG. 7C and FIG. 12 and related description.

Each of the first conductive wire and the second conductive wire may be aligned with the connection wire. The second conductive wire may be positioned between the connection wire and the portion of the insulating layer. The features can be appreciated from, for example, one or more of FIG. 7A, FIG. 7B, FIG. 7C and FIG. 12 and related description.

A second edge of the insulating layer may intersect the connection wire (in the plan view of the display apparatus with the bent portion being flat or bent). The features can be appreciated from, for example, one or more of FIG. 4A, FIG. 4B, FIG. 4C and FIG. 9 and related description.

A third edge of the insulating layer may intersect the connection wire (in the plan view of the display apparatus with the bent portion being flat or bent). The features can be appreciated from, for example, one or more of FIG. 4A, FIG. 4B, FIG. 4C and FIG. 9 and related description.

The first edge of the insulating layer may extend parallel to the connection wire and may be shorter than the connection wire. The features can be appreciated from, for example, one or more of FIG. 4A, FIG. 4B, FIG. 4C, FIG. 11, FIG. 13A, FIG. 13B, and FIG. 13C and related description.

The portion of the insulating layer may be positioned on the second portion of the substrate. The features can be appreciated from, for example, one or more of FIG. 4A, FIG. 4B, FIG. 4C, FIG. 6, FIG. 7A, FIG. 7B, FIG. 7C, FIG. 9, FIG. 10, FIG. 11, FIG. 12, FIG. 13A, FIG. 13B, and FIG. 13C and related description.

A portion of the second portion of the substrate may be positioned between the first portion of the substrate and the portion of the insulating layer. The features can be appreciated from, for example, one or more of FIG. 4A, FIG. 4B, FIG. 4C, FIG. 6, FIG. 9, and FIG. 10 and related description.

The first conductive wire may be aligned with the second conductive wire in a first direction and may be positioned on the second portion. The second portion may be narrower than the first portion in the first direction. The features can be appreciated from, for example, one or more of FIG. 9 and FIG. 11 and related description.

The second portion may be narrower than the bent portion in the first direction. The features can be appreciated from, for example, FIG. 9 and related description.

The bent portion may be narrower than the first portion in the first direction. The features can be appreciated from, for example, FIG. 11 and related description.

Each of the first conductive wire and the second conductive wire may be aligned with the connection wire in a first direction. The second portion may be connected to the bent portion in the first direction. The features can be appreciated from, for example, one or more of FIG. 7A, FIG. 7B, FIG. 7C and FIG. 12 and related description.

The portion of the insulating layer may be positioned on the second portion of the substrate. The second portion of the substrate may be narrower than the first portion of the substrate in a second direction. The second direction may be perpendicular to the first direction. The features can be appreciated from, for example, FIG. 12 and related description.

The bent portion of the substrate may be narrower than the first portion of the substrate in the second direction. The features can be appreciated from, for example, FIG. 12 and related description.

An embodiment may be related to a display apparatus. The display apparatus may include a substrate, a component, a connection wire, a first conductive wire, and a second conductive wire. The substrate may include a first portion, a second portion, and a bent portion. The first portion may be connected through the bent portion to the second portion. The component may be positioned on at least one of the first portion and the bent portion. The connection wire may be positioned on at least the bent portion and electrically connected to the component. The first conductive wire may be formed of a first material, may overlap a surface of the substrate, and may have a first end surface. The first end surface may not be parallel to the surface of the substrate. The second conductive wire may be formed of the first material, may be electrically insulated from the first conductive wire, may be electrically connected to the connection wire, and may have a second end surface. The second end surface may not be parallel to the surface of the substrate. A shape of the second end surface may be substantially a mirror image of a shape of the first end surface. A size of the second end surface may be substantially equal to a size of the first end surface. The second end surface may be positioned closer to the first end surface than all other portions of the second conductive wire. The features can be appreciated from, for example, one or more of FIG. 1, FIG. 2, FIG. 4A, FIG. 4B, FIG. 4C, FIG. 6, FIG. 7A, FIG. 7B, FIG. 7C, FIG. 9, FIG. 10, FIG. 11, FIG. 12, FIG. 13A, FIG. 13B, and FIG. 13C and related description.

BRIEF DESCRIPTION OF THE DRAWINGS

FIG. 13A is a schematic plan view of a part of a display apparatus according to an embodiment. FIG. 13B is a cross-sectional view of a portion of the display apparatus according to an embodiment. FIG. 13C is a cross-sectional view of a portion of the display apparatus according to an embodiment.

DETAILED DESCRIPTION

Figure 1:
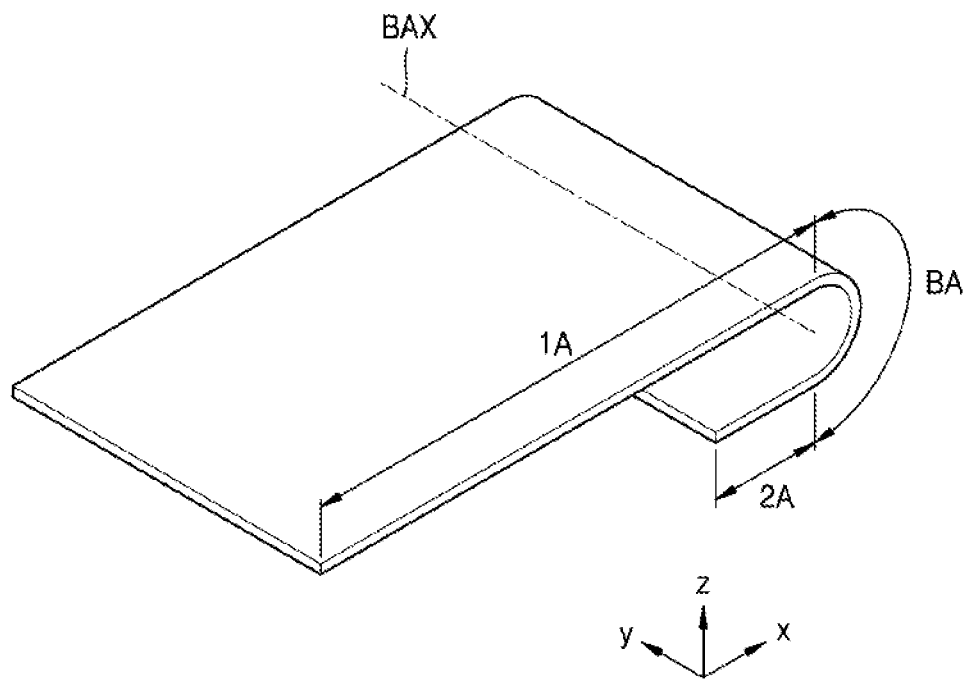
FIG. 1 is a schematic perspective view of a part of a display apparatus according to an embodiment.

Example embodiments are described with reference to the accompanying drawings, wherein like reference numerals may refer to like elements.

Although the terms "first", "second", etc. may be used herein to describe various elements, these elements, should not be limited by these terms. These terms may be used to distinguish one element from another element. Thus, a first element discussed below may be termed a second element without departing from teachings of one or more embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

In this application, "first area" may mean and/or may be "first portion"; "second area" may mean and/or may be "second portion"; "bent area" may mean and/or may be "bent portion" and/or "intermediate portion"; "discontinued portion" may mean and/or may be "discontinuity". When a first element (e.g., a layer, region, or component) is referred to as being "on" a second element, the first element can be directly or indirectly on the second element, and no intended intervening element or at least one intervening element may be present. Sizes of components in the drawings may be exaggerated for convenience of explanation and may not limit embodiments.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not necessarily perpendicular to one another.

Figure 2:
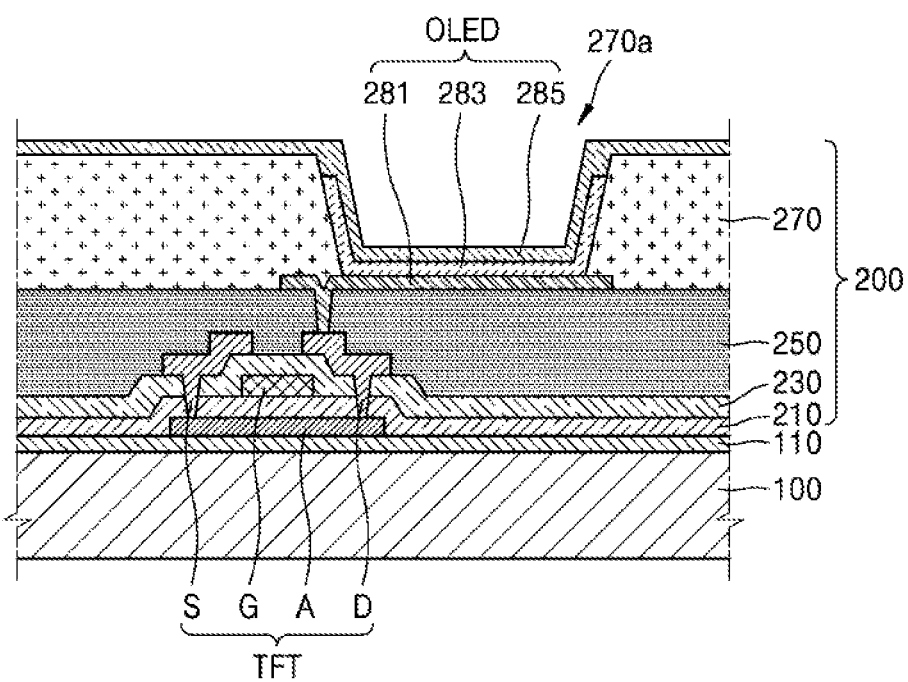
FIG. 2 is a schematic cross-sectional view of a part of a display apparatus according to an embodiment.
Figure 3:
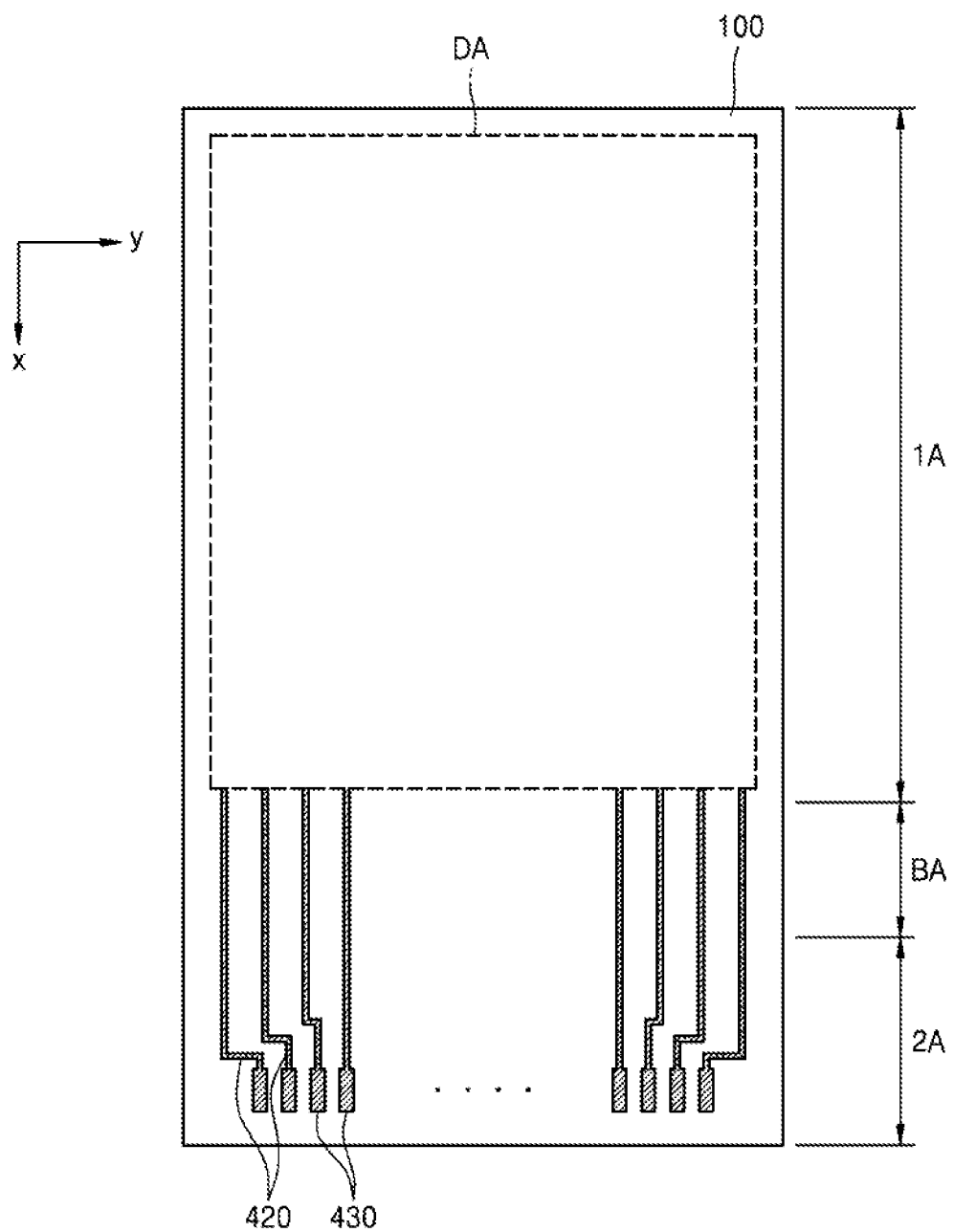
FIG. 3 is a schematic plan view of a part of a display apparatus according to an embodiment.

FIG. 1 is a schematic perspective view of a part of a display apparatus according to an embodiment. FIG. 2 is a schematic cross-sectional view of a part of the display apparatus of FIG. 1. FIG. 3 is a schematic plan view of a part of the display apparatus of FIG. 1. FIG. 4A is a schematic plan view of a part of the display apparatus of FIG. 1. FIG. 4B is a cross-sectional view of a portion of the display apparatus according to an embodiment. FIG. 4C is a cross-sectional view of a portion of the display apparatus according to an embodiment.

In the display apparatus, as illustrated in FIG. 1, since a substrate 100, which is a part of the display apparatus, is partially bent, the part of the display apparatus has a bent shape like the substrate 100. For convenience of illustration, FIGS. 3 and 4A illustrate that the display apparatus is not in a state of being bent. For reference, in the drawings referred to in the following descriptions, the display apparatus may be illustrated not in a state of being bent for convenience of illustration.

As illustrated in FIG. 1, the substrate 100 of the display apparatus may include a bent area BA extending in a first direction (+y direction). The bent area BA is located between a first area 1A and a second area 2A in a second direction crossing the first direction. The substrate 100 is bent with respect to a bending axis BAX extending in the first direction (+y direction) as illustrated in FIG. 1. Accordingly, a rear surface of the second area 2A faces at least part of a rear surface of the first area 1A.

The substrate 100 may include one or more of various material exhibiting flexible or bendable properties, for example, polymer resin such as polyethersulphone (PES), polyacrylate, polyetherimide (PEI), polyethylene naphthalate (PEN), polyethyleneterephthalate (PET), polyphenylene sulfide (PPS), polyarylate, polyimide (PI), polycarbonate (PC), or cellulose acetate propionate (CAP).

Figure 4:
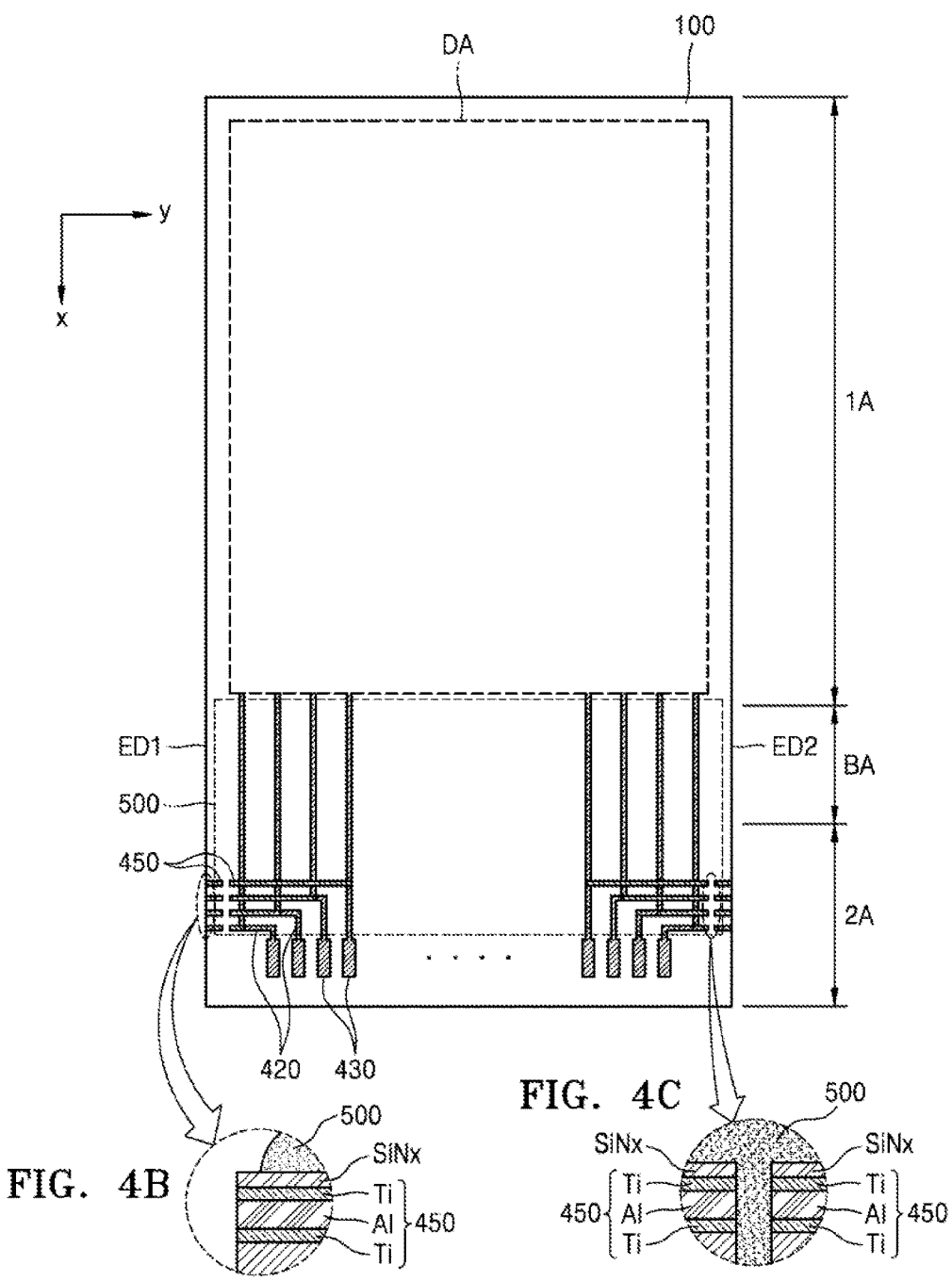
FIG. 4A is a schematic plan view of a part of a display apparatus according to an embodiment.
FIG. 4B is a cross-sectional view of a portion of the display apparatus according to an embodiment.
FIG. 4C is a cross-sectional view of a portion of the display apparatus according to an embodiment.

The first area 1A may include a display area DA, as illustrates in FIGS. 3 and 4. The first area 1A may include a part of a non-display area located outside the display area DA, in addition to the display area DA, as illustrated in FIGS. 3 and 4. The second area 2A may include the non-display area as well.

A display portion may be located in the display area DA of the substrate 100. FIG. 2 illustrates that the display portion includes a display device such as organic light-emitting device (OLED) and a thin film transistor (TFT) to which the display device is electrically connected. FIG. 2 illustrates that the OLED as the display device is included in the display portion located in the display area DA. The electrical connection of the OLED to the TFT may be understood to be a pixel electrode 281 of the OLED being electrically connected to the TFT. As necessary, the TFT may be arranged in a peripheral area outside the display area DA of the substrate 100. The TFT located in the peripheral area may be, for example, a part of a bent area BA for controlling an electric signal applied to the display area DA.

The TFT may include a semiconductor layer A including amorphous silicon, polycrystalline silicon, or an organic semiconductor material, a gate electrode G, a source electrode S, and a drain electrode D. To secure insulation between the semiconductor layer A and the gate electrode G, a gate insulating film 210 including an inorganic material such as a silicon oxide, a silicon nitride, and/or a silicon oxynitride may be interposed between the semiconductor layer A and the gate electrode G. In addition, an interlayer insulating film 230 including an inorganic material such as a silicon oxide, a silicon nitride, and/or a silicon oxynitride may be arranged on the gate electrode G. The source electrode S and the drain electrode D may be arranged on the interlayer insulating film 230. In embodiments, the insulating film including an inorganic material may be formed by a chemical vapor deposition (CVD) method or an atomic layer deposition (ALD) method. This applies to the below-described embodiments or modified examples thereof.

A buffer layer 110 including an inorganic material such as a silicon oxide, a silicon nitride, and/or a silicon oxynitride may be interposed between the TFT and the substrate 100 configured as above. The buffer layer 110 may improve leveling of an upper surface of the substrate 100, or may prevent or reduce intrusion of impurities from the substrate 100 into the semiconductor layer A of the TFT.

A planarization layer 250 may be arranged on the TFT. For example, as illustrated in FIG. 2, when an OLED is arranged above the TFT, the planarization layer 250 may substantially planarize an upper portion of a protection film covering the TFT. The planarization layer 250 may be formed of, for example, an organic material such as acryl, benzocyclobutene (BCB), or hexamethyldisiloxane (HMDSO). Although FIG. 2 illustrates that the planarization layer 250 is a single layer, the planarization layer 250 may be, for example, a multilayer, and various modifications thereof are possible. Also, as the planarization layer 250 has an opening outside the display area DA, a part of the planarization layer 250 in the display area DA and a part of the planarization layer 250 in the second area 2A may be physically separated from each other. This is to prevent external impurities from intruding into the display area DA through the planarization layer 250.

Unlike the illustration of FIG. 2, a protection layer (not shown) including a silicon oxide, a silicon nitride, and/or a silicon oxynitride may be interposed between the TFT and the planarization layer 250. In embodiments, the display apparatus may be variously modified. For example, only the protection layer covering the TFT exists while the planarization layer 250 is omitted. In the following description, for convenience of explanation, the display apparatus includes only the planarization layer 250.

In the display area DA of the substrate 100, the OLED including the pixel electrode 281, a counter electrode 285, and an intermediate layer 283 interposed therebetween and having a light-emitting layer may be located on the planarization layer 250. The pixel electrode 281, as illustrated in FIG. 2, is electrically connected to the TFT by contacting anyone of the source electrode S and the drain electrode D via an opening portion formed in the planarization layer 250.

A pixel define film 270 may be arranged on the planarization layer 250. The pixel define film 270 may include an opening 270a corresponding to each of sub-pixels and exposing at least a center portion of the pixel electrode 281, thereby defining a pixel. Also, as illustrated in FIG. 2, the pixel define film 270 increase a distance between an edge of the pixel electrode 281 and the counter electrode 285 above the pixel electrode 281, thereby preventing generation of arc at the edge of the pixel electrode 281. The pixel define film 270 may be formed of, for example, an organic material such as polyimide or hexamethyldisiloxane (HMDSO).

The intermediate layer 283 of the OLED may include a low molecular material or a polymer material. When the intermediate layer 283 of the OLED may include a low molecular material, the intermediate layer 283 may have a structure in which a hole injection layer (HIL), a hole transport layer (HTL), an emission layer (EML), an electron transport layer (ETL), and an electron injection layer (EIL) are stacked, and may include one or more of various organic materials such as copper phthalocyanine (CuPc), N,N'-Di (naphthalene-1-yl)-N,N'-diphenyl-benzidine: (NPB), tris-8-hydroxyquinoline aluminum ($Alq_3$), etc. The above layers may be formed by a vacuum deposition method.

When the intermediate layer 283 includes a polymer material, the intermediate layer 283 may generally have a structure including an HTL and an EML. The HTL may include PEDOT, and the EML may include a polymer material such as poly-phenylenevinylene (PPV) based polymer and/or polyfluorene based polymer. The intermediate layer 283 may be formed by a screen printing method, an inkjet printing method, or a laser induced thermal imaging (LITI) method.

The intermediate layer 283 is not limited thereto and may have various structures. The intermediate layer 283 may include a layer integrally formed for a plurality of pixel electrodes 281 or a layer patterned corresponding to each of the pixel electrodes 281.

The counter electrode 285 may be arranged above the display area DA to cover the display area DA. In other words, the counter electrode 285 may be integrally formed with respect to a plurality of OLEDs to correspond to the pixel electrodes 281.

Since the OLED may be easily damaged by external moisture or oxygen, an encapsulation layer (not shown) is further provided to cover the OLED, thereby protecting the same. For example, the encapsulation layer may extend to the outside of the display area DA, covering the display area DA.

The encapsulation layer may include a first inorganic encapsulation layer, an organic encapsulation layer on the first inorganic encapsulation layer, and a second inorganic encapsulation layer on the organic encapsulation layer. As necessary, other layers such as a capping layer may be interposed between the first inorganic encapsulation layer and the counter electrode 285. The first inorganic encapsulation layer and/or the second inorganic encapsulation layer may include a silicon oxide, a silicon nitride, and/or a silicon oxynitride. Since the first inorganic encapsulation layer is formed along a structure thereunder, an upper surface of the first inorganic encapsulation layer may not be flat. The organic encapsulation layer covers the first inorganic encapsulation layer to make an upper surface thereof almost flat, unlike the first inorganic encapsulation layer. In detail, the organic encapsulation layer may have the upper surface that is almost flat in a portion corresponding to the display area DA. The organic encapsulation layer may include one or more materials selected from polyethersulphone (PES), polyacrylate, polyetherimide (PEI), polyethylene naphthalate (PEN), polyethyleneterephthalate (PET), polyphenylene sulfide (PPS), polyarylate, polyimide (PI), polycarbonate (PC), and cellulose acetate propionate (CAP). The second inorganic encapsulation layer contacts the first inorganic encapsulation layer at an edge located outside the display area DA, thereby preventing the organic encapsulation layer from being exposed to the outside.

In embodiments, since the encapsulation layer may include the first inorganic encapsulation layer, the organic encapsulation layer, and the second inorganic encapsulation layer, even when a crack is generated in the encapsulation layer, the above multilayer structure may prevent the crack from being connected between the first inorganic encapsulation layer and the organic encapsulation layer or between the organic encapsulation layer and the second inorganic encapsulation layer. Thus, the generation of a path through which external moisture or oxygen intrudes into the display area DA may be prevented or reduced.

A polarization plate may be located on the encapsulation layer by using an optically clear adhesive (OCA), or a black matrix and a color filter may be provided instead of the polarization plate. Also, a touch electrode of various conductive patterns for a touch screen function may be located on the encapsulation layer, and an insulating layer may be located above or under the touch electrode.

The display apparatus may include a pad 430, a connection wire 420, and a test wire 450, as illustrated in FIGS. 3 and 4A. For reference, to clearly show the pad 430 and the connection wire 420, for convenience of explanation, the test wire 450 is omitted in FIG. 3, whereas all of the pad 430, the connection wire 420, and the test wire 450 are illustrated in FIG. 4A.

The pad 430 is located in the second area 2A of the substrate 100. The connection wire 420 is electrically connected to the pad 430 and extends toward the first area 1A or the bent area BA. The connection wire 420 may electrically connect the pad 430 to various elements located in the first area 1A or the bent area BA. For example, as illustrated in FIG. 4A, the connection wire 420 may electrically connect the pad 430 to the display portion in the display area DA located in the first area 1A. In embodiments, unlike the illustration of FIG. 4A, the connection wire 420 may be electrically connect the pad 430 to the bent area BA such as a shift register located outside the display area DA.

At least part of the connection wire 420 and the pad 430 may be simultaneously formed of the same material in a manufacturing process. For example, the at least part of the connection wire 420 and the pad 430 may include the same material as the conductive material that the gate electrode G of the TFT includes as illustrated in FIG. 2, or the same material as the conductive material that the source electrode S or the drain electrode D includes. Accordingly, like the gate electrode G, the source electrode S, and/or the drain electrode D, the at least part of the connection wire 420 and the pad 430 may have a single-layer or multilayer structure. The at least part of the connection wire 420 and the pad 430 may be formed in one body.

The pad 430 may be electrically connected to a driver integrated circuit (IC) (not shown) or a printed circuit substrate (not shown). In detail, the driver IC or printed circuit substrate may be electrically connected to the pad 430 by using an anisotropic conductive film (ACF) or a self-organizing conductive film (SOCF). The connection wire 420 may electrically transfer electric signals, which are transmitted from the driver IC or printed circuit substrate to the pad 430, to the display portion in the display area DA located in the first area 1A or to a circuit portion such as a shift register located outside the display area DA.

The test wire 450 is located in the second area 2A. The test wire 450 is used to check whether a defect exists in the display apparatus in the manufacturing process of the display apparatus. The test wire 450 is electrically connected to the connection wire 420 or the pad 430. In FIG. 4A, the test wire 450 is illustrated as being electrically connected to the connection wire 420. Referring to FIG. 2, the test wire 450 may include the same material as the conductive material that the gate electrode G of the TFT includes, or the same material as the conductive material that the source electrode S or the drain electrode D includes. Accordingly, like the gate electrode G, the source electrode S, and/or the drain electrode D, the test wire 450 may have a single-layer or multilayer structure.

Although FIG. 4A illustrates that the test wire 450 is electrically connected to the connection wire 420, an insulating layer may be located between the test wire 450 and the connection wire 420 so that the test wire 450 is located on a different layer from the connection wire 420 and the test wire 450 and the connection wire 420 are electrically connected to each other via a contact hole formed in the insulating layer. In other words, although FIG. 4A illustrates that both of the test wire 450 and the connection wire 420 are present in multiple numbers, it is not that each of the test wires 450 is electrically connected to all of the connection wires 420, but that each of the test wires 450 is electrically connected to only an appropriate one of the connection wires 420.

For example, among the four test wires 450 in FIG. 4A, the test wire 450 that is located closest to the first area 1A (−x direction) may extend in a direction (+y direction) from a first edge ED1 to a second edge ED2, to be electrically connected to the fourth connection wire 420 via the contact hole by passing over the other three of the connection wires 420. Here, the first edge ED1 and the second edge ED2 extend in a direction (+x direction) crossing the bending axis BAX (see FIG. 1) of the bent area BA.

In this case, the at least part of the connection wire 420 and the pad 430 are formed at the same time when the gate electrode G of the TFT is formed; the insulating layer covering the at least part of the connection wire 420 and the pad 430 may be formed at the same time when the interlayer insulating film 230 is formed; the contact hole penetrating through the insulating layer on the connection wire 420 may be formed at the same time when a through-hole penetrating through the interlayer insulating film 230 and the gate insulating film 210 is formed; and the test wire 450 may be formed at the same time when the source electrode S and the drain electrode D are formed in FIG. 2. If the test wire 450 is located in a lower side and the connection wire 420 is located in an upper side, the test wire 450 may be formed at the same time when the gate electrode G of the TFT is formed in FIG. 2; the insulating layer covering the test wire 450 may be formed at the same time when the interlayer insulating film 230 is formed in FIG. 2; the contact hole penetrating though the insulating layer on the test wire 450 may be formed at the same time when the through-hole penetrating through the interlayer insulating film 230 and the gate insulating film 210 is formed in FIG. 2; and the at least part of the connection wire 420 and the pad 430 may be formed at the same time when the source electrode S and the drain electrode D are formed in FIG. 2.

The test wire 450 extends to an end surface of the first edge ED1 of the substrate 100 as illustrated in FIG. 4A. In this state, the test wire 450 has a discontinued portion between the connection wire 420 and the first edge ED1, as illustrated in FIG. 4A, a portion (i.e., a first conductive wire) located at the first edge ED1 of the substrate 100 and a portion (i.e., a second conductive wire) connected to the connection wire 420 are physically separated and electrically insulated from each other. Also, as illustrated in FIG. 4A, the display apparatus may include the test wire 450 in a multiple number and some of the test wires 450 may extend to an end surface of the second edge ED2 of the substrate 100 located at the opposite side to the first edge ED1 of the substrate 100 and have the discontinued portion so that a portion located at the second edge ED2 of the substrate 100 and a portion connected to the connection wire 420 may be physically separated from each other. In embodiments, since the shape of the test wire 450 extending in a direction toward the second edge ED2 may be understood to be symmetrical to the shape of the test wire 450 extending in a direction toward the first edge ED1, in the following description, the test wire 450 extending in the direction toward the first edge ED1 only is described for convenience of explanation.

Figure 5:
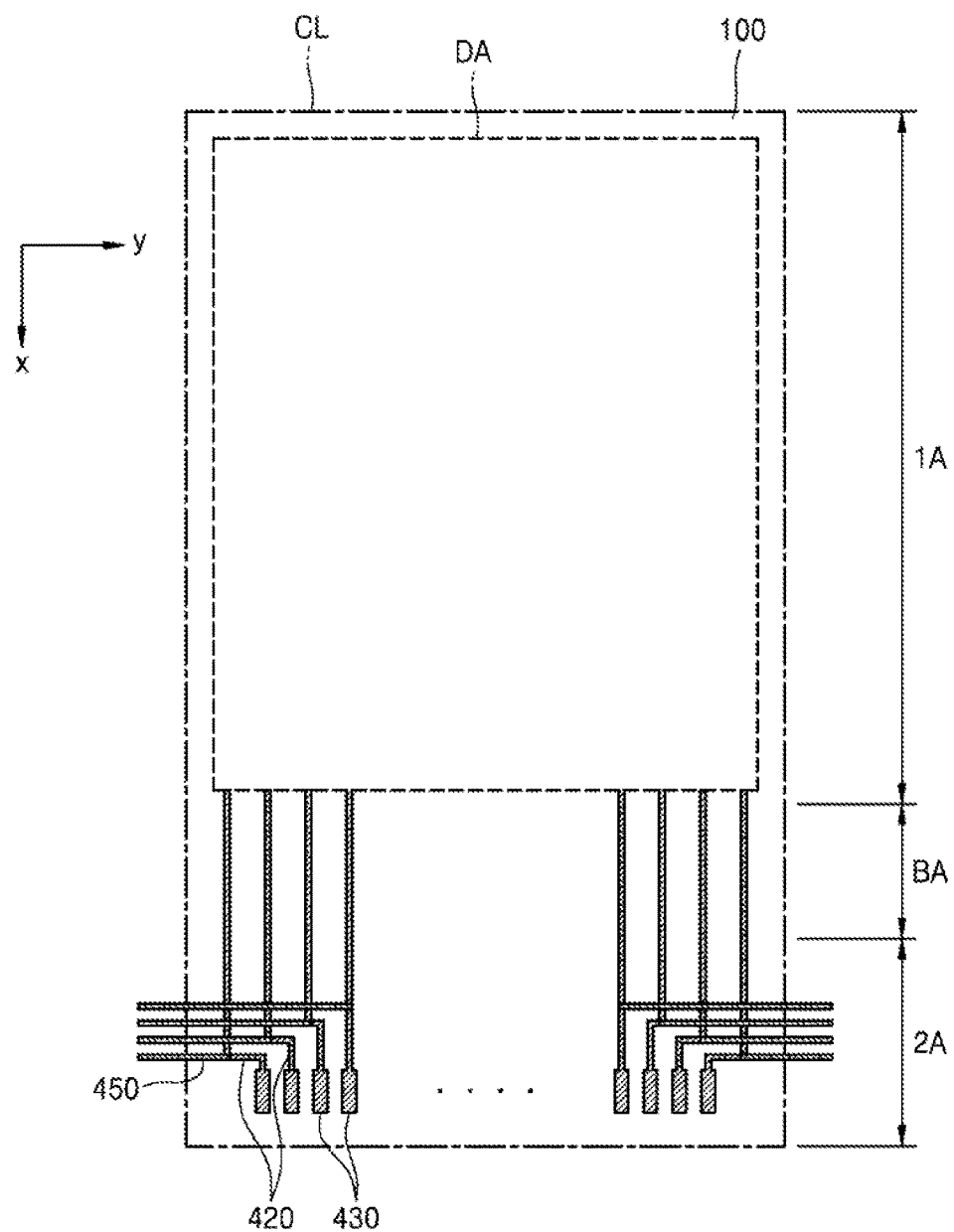
FIG. 5 is a schematic plan view of a part of a display apparatus during a manufacturing process according to an embodiment.

FIG. 5 is a schematic plan view of a part of the display apparatus of FIG. 1 during a manufacturing process. While only one display apparatus may be manufactured during manufacturing of a display apparatus, it is economical to manufacture a plurality of display apparatuses at the same time. In this regard, the display portion is formed in each of the display areas DA on a mother substrate and the mother substrate is cut along an outline of each display area DA, thereby simultaneously manufacturing the display apparatuses. In FIG. 5, for convenience of explanation, the reference numeral for the substrate 100 of FIGS. 2 to 4 is used for the mother substrate, and a cutting line CL for cutting the mother substrate is illustrated.

In embodiments, when a plurality of display apparatuses are manufactured, in some manufacturing processes, the test wire 450 does not have the discontinued portion as illustrated in FIG. 5. The test wire 450 has a shape extending across the cutting line CL that corresponds to a portion that will be an edge of the substrate 100 of a display apparatus later. In this state, prior to cutting the mother substrate 100 along the cutting line CL, whether defects are generated in portions that will be a plurality of display apparatuses later is checked by applying electric signals to the display portion of the display area DA through the test wire 450 or detecting the electric signal through the test wire 450. Then, the mother substrate 100 is cut along the cutting line CL so that multiple display portions are simultaneously manufactured.

As the mother substrate 100 is cut along the cutting line CL, the test wire 450 is cut as well. Accordingly, as may be appreciated from FIG. 4B that schematically illustrates the display apparatus, the test wire 450 extends to the end surface of the first edge ED1 extending in a direction crossing the bending axis BAX of the substrate 100. Furthermore, an end surface of an end portion of the test wire 450 is flush with the end surface of the first edge ED1 of the substrate 100. A sectional view in FIG. 4B illustrates that the end surface of the end portion of the test wire 450 is flush with an end surface of an end portion of the insulating layer located thereunder. Accordingly, the end surface of the end portion of the test wire 450 is exposed to an external environment, without being covered by the insulating layer such as a silicon nitride on the test wire 450.

In this case, the exposed portion of the test wire 450 may be damaged, for example, oxidized, by external moisture. Accordingly, if the test wire 450 has no discontinued portion as illustrated in FIG. 5, the external moisture intrudes into the display apparatus along the test wire 450 so that the pad 430 or the connection wire 420 connected to the test wire 450, moreover various elements in the display area DA, may be damaged. Also, when an unintended electrical signal such as static electricity from the outside is applied to the exposed portion of the test wire 450, if the test wire 450 does not have the discontinued portion as illustrated in FIG. 5, an unintended electrical signal from the outside may transferred to the inside of the display apparatus along the test wire 450 so that the pad 430 or the connection wire 420 connected to the test wire 450, moreover various elements in the display area DA, may be damaged or may malfunction.

However, in the case of the display apparatus, the test wire 450 has the discontinued portion as illustrated in FIG. 4A so that the portion located at the first edge ED1 of the substrate 100 and the portion connected to the connection wire 420 are physically separated from each other. Accordingly, even when the portion of the test wire 450 located at the first edge ED1 of the substrate 100 is damaged, the portion of the test wire 450 connected to the connection wire 420 that is physically separated from the portion of the test wire 450 located at the first edge ED1 of the substrate 100 is not damaged. Also, even when an unintended electrical signal is applied to the portion of the test wire 450 located at the first edge ED1 of the substrate 100, the electrical signal is not transferred to the portion of the test wire 450 connected to the connection wire 420. Accordingly, the pad 430, the connection wire 420, and/or various elements in the display area DA may be effectively prevented from being damaged or malfunctioning.

The discontinued portion of the test wire 450 may be formed after detection of possible defects and may be formed before or after the mother substrate 100 is cut. The discontinued portion may be formed on the test wire 450 using various methods, for example, irradiating a laser beam to a position where the discontinued portion of the test wire 450 is to be formed.

In this case, not only the insulating layer such as a silicon nitride on the test wire 450, but also at least part of the layer located under the test wire 450 may be removed altogether, if necessary, as illustrated in a sectional view at FIG. 4C. In particular, to secure that the test wire 450 is surely discontinued, as illustrated in the sectional view at FIG. 4C, at least part of the layer located under the test wire 450 may be removed altogether. This applies to the below-described embodiments or modified examples thereof.

When the at least part of the connection wire 420 and the pad 430 are simultaneously formed of the same material as the gate electrode G of the TFT and the test wire 450 is simultaneously formed of the same material as the source electrode S and the drain electrode D of the TFT, the test wire 450 may have a multilayer structure including a titanium layer, an aluminum layer, and a titanium layer, and the interlayer insulating film 230 is located thereunder. Accordingly, in this case, when the discontinued portion of the test wire 450 is formed, a through-hole or groove corresponding to the discontinued portion of the test wire 450 may be formed in the interlayer insulating film 230. When the test wire 450 is simultaneously formed of the same material as the gate electrode G of the TFT and the at least part of the connection wire 420 and the pad 430 is simultaneously formed of the same material as the source electrode S and the drain electrode D of the TFT, the gate insulating film 210 is located under the test wire 450. Accordingly, in this case, when the discontinued portion of the test wire 450 is formed, a through-hole or groove corresponding to the discontinued portion of the test wire 450 may be formed in the gate insulating film 210.

Figure 6:
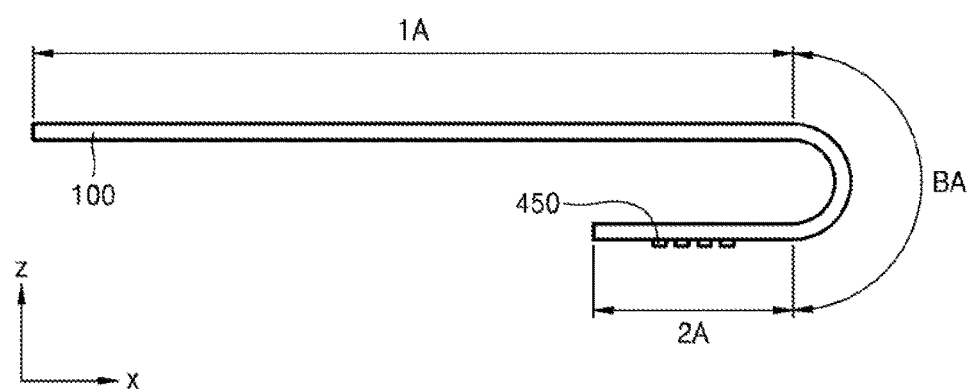
FIG. 6 is a schematic side view of a part of a display apparatus according to an embodiment.

FIG. 6 is a schematic side view of a part of the display apparatus of FIG. 1. As described above, the substrate 100 is bent in the bent area BA with respect to the bending axis BAX so that the rear surface of the second area 2A faces the at least part of the rear surface of the first area 1A. Accordingly, the end surface of the end portion of the test wire 450 exposed to the outside from the first edge ED1 or the second edge ED2 of the substrate 100 is located under the first area 1A of the substrate 100 as illustrated in FIG. 6. Accordingly, when the display apparatus is viewed in a direction (−z direction) in which a viewer watches the display apparatus, the end surface of the end portion of the test wire 450 is located in the inner side of the display apparatus, not in the outermost area of the display apparatus (+x direction).

An unintended large electrical signal such as strong static electricity may be unexpectedly applied to the test wire 450 during the manufacturing process or a usage process after the discontinued portion is formed. In this case, as described above, even when the test wire 450 has the discontinued portion, the unintended electrical signal may be transferred to the pad 430, the connection wire 420, and/or the display portion due to a dielectric breakdown or tunneling effect so that the display apparatus may malfunction or may be damaged.

However, in the display apparatus, as illustrated in FIG. 6, since the end surface of the end portion of the test wire 450 that is exposed to the outside at the first edge ED1 or the second edge ED2 of the substrate 100 is located under the first area 1A of the substrate 100, a probability that the static electricity reaches the test wire 450 may be remarkably lowered. In detail, as described above, various elements such as the TFT, the OLED, the encapsulation layer, the touch electrode, and/or the polarization plate may be located in the first area 1A. Accordingly, the various elements may effectively shield the test wing 450 located thereunder from external static electricity.

As may be seen from the sectional view at FIG. 4C, the display apparatus may further include an insulating layer 500 that covers an inner side surface of the discontinued portion of the test wire 450. In FIG. 4A, the insulating layer 500 covers at least part of an upper surface of the test wire 450 in addition to the inner side surface of the discontinued portion of the test wire 450. If the insulating layer 500 does not exist, the inner side surface of the discontinued portion of the test wire 450 may be exposed to the external environment. In this case, although it is less probable than a portion of the test wire 450 exposed at the first edge ED1 or the second edge ED2 of the substrate 100, the inner side surface of the discontinued portion of the test wire 450 may be damaged by external moisture or external static electricity may be applied to the inner side surface of the discontinued portion of the test wire 450. However, as illustrated in FIG. 4A, FIG. 4B, and FIG. 4C, since the insulating layer 500 covers the inner side surface of the discontinued portion of the test wire 450, potential damage or defect may be prevented in advance. This applies to the below-described embodiments or modified examples thereof. The insulating layer 500 may be formed of a suitable electrically insulating material.

In embodiments, the insulating layer 500 covering the inner side surface of the discontinued portion of the test wire 450 may be formed in various methods. For example, the display apparatus may include a bending protection layer (BPL) covering the bent area BA of the substrate 100. In this case, when the bending protection layer is formed, the insulating layer 500 covering the inner side surface of the discontinued portion of the test wire 450 may be simultaneously formed of the same material. In other words, if necessary, as the bending protection layer covers not only the bent area BA, but also at least part of the second area 2A, the bending protection layer may function as the insulating layer 500 that covers the inner side surface of the discontinued portion of the test wire 450. For reference, in FIG. 4A in which the insulating layer 500 is the bending protection layer, the position of the bending protection layer is indicated by a dashed line. In this case, the pad 430 that is electrically connected to an external electronic device or a printed circuit substrate may not be covered by the insulating layer 500. This applies to the below-described embodiments or modified examples thereof.

For reference, the bending protection layer is described below. When a certain stack structure is to be bent, a stress neutral plane exists in the stack structure. Accordingly, the stress neutral plane may be arranged at or nearby a position corresponding to an element that is important or has weak durability in the bent area BA, for example, the connection wire 420. When the bending protection layer does not exist, excessive tension stress may be applied to the connection wire 420 in the bent area BA according to the bending of the substrate 100. This is because the position of the connection wire 420 may not correspond to the stress neutral plane. However, as the bending protection layer exists and a thickness and a modulus thereof are adjusted, the position of the stress neutral plane may be adjusted in the stack structure including all of the substrate 100, the connection wire 420, and the bending protection layer. Accordingly, as the stress neutral plane is arranged near the connection wire 420 by using the bending protection layer, the tension stress applied to the connection wire 420 may be reduced.

In embodiments, when the bending protection layer is formed, the insulating layer 500 covering the inner side surface of the discontinued portion of the test wire 450 may be simultaneously formed of the same material. If necessary, as the bending protection layer covers not only the bent area BA, but also at least part of the second area 2A, the bending protection layer may function as the insulating layer 500 that covers the inner side surface of the discontinued portion of the test wire 450. In this case, in the manufacturing process, the discontinued portion is formed in the test wire 450 by irradiating a laser beam to the test wire 450, and after forming the bending protection layer, bending is performed in the bent area BA of the substrate 100. The bending protection layer may be formed in various methods. For example, a dam is formed of a material such polyimide by a dotting method or an inkjet printing method as at an edge of an area where the bending protection layer is to be formed, and a material in a liquid or past state for forming the bending protection layer is dotted or coated in the dam, thereby forming the bending protection layer.

Figure 7A:
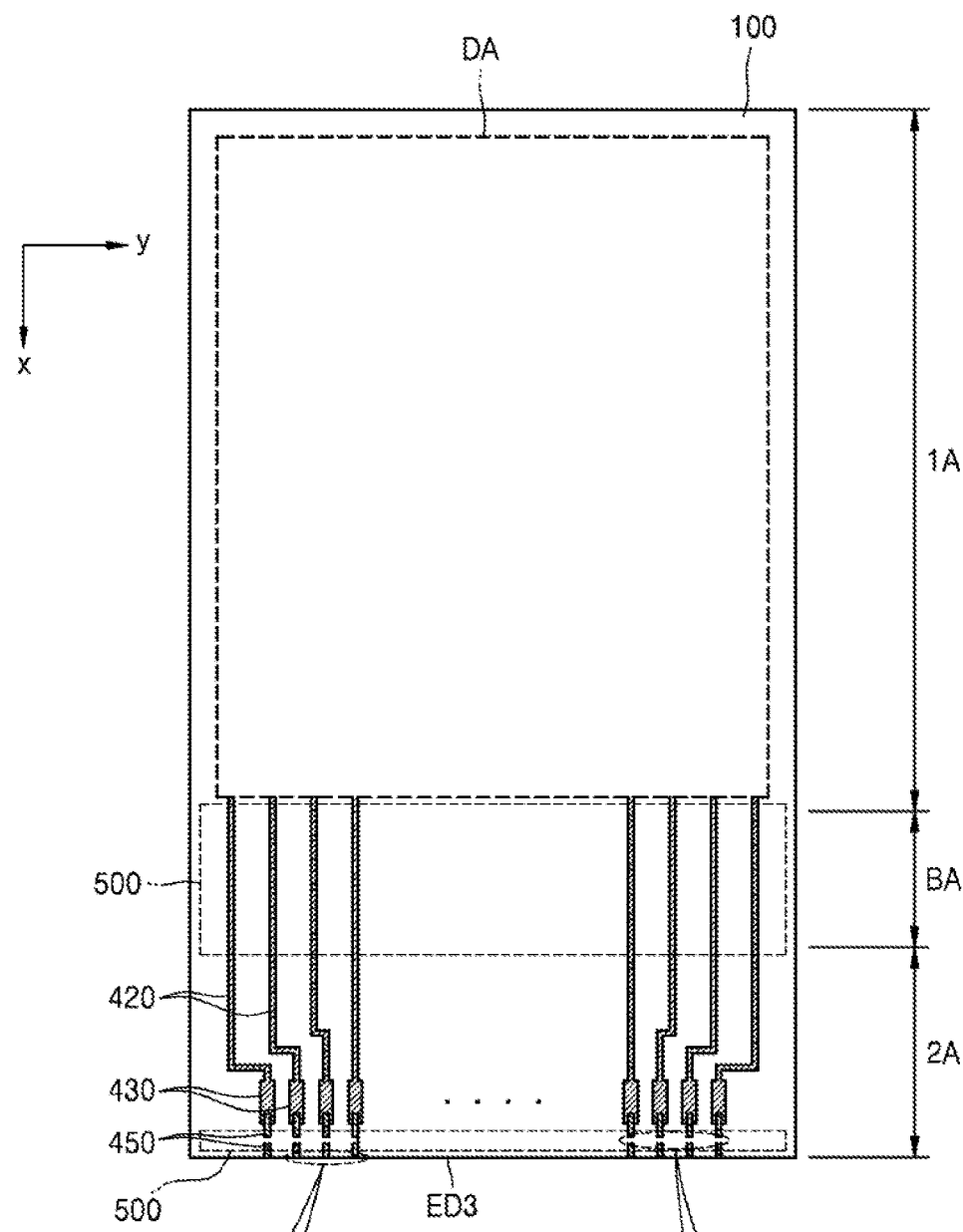
FIG. 7A is a schematic plan view of a part of a display apparatus according to an embodiment.

Although in the above description the test wire 450 is connected to the connection wire 420, the present disclosure is not limited thereto. For example, as illustrated in FIG. 7A, a schematic plan view of a part of a display apparatus according to an embodiment, the test wire 450 may be electrically connected to the pad 430. In FIG. 7A, the pad 430 is simultaneously formed of the same material as the gate electrode G of the TFT and the test wire 450 is simultaneously formed of the same material as the source electrode S and the drain electrode D of the TFT, and part of the test wire 450 is located above the pad 430 so that the test wire 450 is electrically connected to the pad 430 through a contact hole in the insulating layer located between the test wire 450 and the pad 430. In contrast, the test wire 450 may be simultaneously formed of the same material as the gate electrode G of the TFT and the pad 430 may be simultaneously formed of the same material as the source electrode S and the drain electrode D of the TFT, or various modifications thereof are possible.

When the test wire 450 is electrically connected to the pad 430, the test wire 450 may extend to an end surface of a third edge ED3 of the substrate 100 extending in a direction parallel to the bending axis BAX (see FIG. 1). This is similar to the description presented above with reference to FIG. 5. In other words, in the manufacturing process, prior to the cutting of the substrate 100, the test wire 450 connected to the pad 430 has a shape extending in a direction (+x direction) passing a cutting line of the substrate 100 corresponding to the third edge ED3 of FIG. 7A, and then, the test wire 450 is cut together as the substrate 100 is cut later.

In the case of the display apparatus, the test wire 450 has the discontinued portion between the pad 430 and the third edge ED3 of the substrate 100 and thus a portion located at the third edge ED3 of the substrate 100 and a portion connected to the pad 430 may be physically separated from each other. Accordingly, even when the portion of the test wire 450 located at the third edge ED3 of the substrate 100 is damaged, the portion of the test wire 450 connected to the pad 430 that is physically separated from the portion of the test wire 450 located at the third edge ED3 of the substrate 100 may not be damaged. Also, even when an unintended electrical signal is applied to the portion of the test wire 450 located at the third edge ED3 of the substrate 100, the electrical signal is not transferred to the portion of the test wire 450 connected to the pad 430. Accordingly, the pad 430, the connection wire 420, and/or the various elements in the display area DA may be effectively prevented from being damaged or malfunctioning.

In particular, referring to FIG. 1 or 6, when the display apparatus is viewed in a direction (−z direction) in which a viewer watches the display apparatus, the third edge ED3 of the substrate 100 is located in a direction toward the inside of the display apparatus to be spaced farthest from the edge (+x direction). Accordingly, in the display apparatus, since the end surface of the end portion of the test wire 450 that is exposed to the outside at the third edge ED3 of the substrate 100 is located in the innermost side of the display apparatus, the test wire 450 may be effectively shielded from external static electricity.

Figures 7B, 7C:
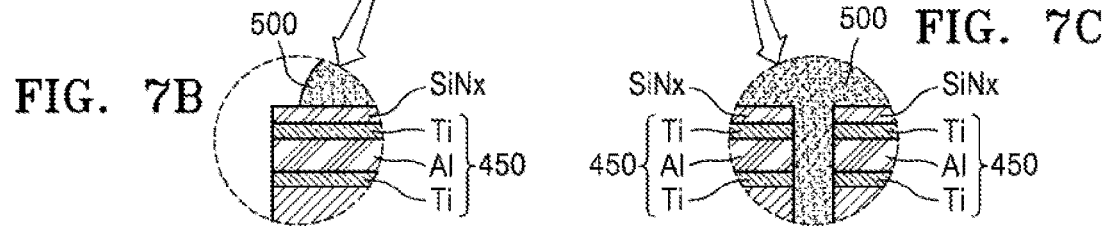
FIG. 7B is a cross-sectional view of a portion of the display apparatus according to an embodiment.
FIG. 7C is a cross-sectional view of a portion of the display apparatus according to an embodiment.

The display apparatus may further include the insulating layer 500 covering the inner side surface of the discontinued portion of the test wire 450. If the insulating layer 500 does not exist, the inner side surface of the discontinued portion of the test wire 450 may be exposed to the external environment. In this case, although it is less probable than the portion of the test wire 450 exposed at the third edge ED3 of the substrate 100, the inner side surface of the discontinued portion of the test wire 450 may be damaged by external moisture or external static electricity may be applied to the inner side surface of the discontinued portion of the test wire 450. However, as illustrated in FIG. 7A, FIG. 7B, and FIG. 7C, as the insulating layer 500 covers the inner side surface of the discontinued portion of the test wire 450, the generation of defects may be prevented in advance. This applies to the below-described embodiments or modified examples thereof.

Like the case of the display apparatus according to the above-described embodiment in FIG. 4A, the insulating layer 500 may be simultaneously formed of the same material as the bending protection layer covering the bent area BA. However, since the pad 430 does not need to be covered by the insulating layer 500, as illustrated in FIG. 7A, the portion covering the discontinued portion of the test wire 450 may be separated from the portion covering the bent area BA. The insulating layer 500 may be formed in an independent process regardless of the process of forming the bending protection layer. This applies to the below-described embodiments or modified examples thereof.

Figure 8:
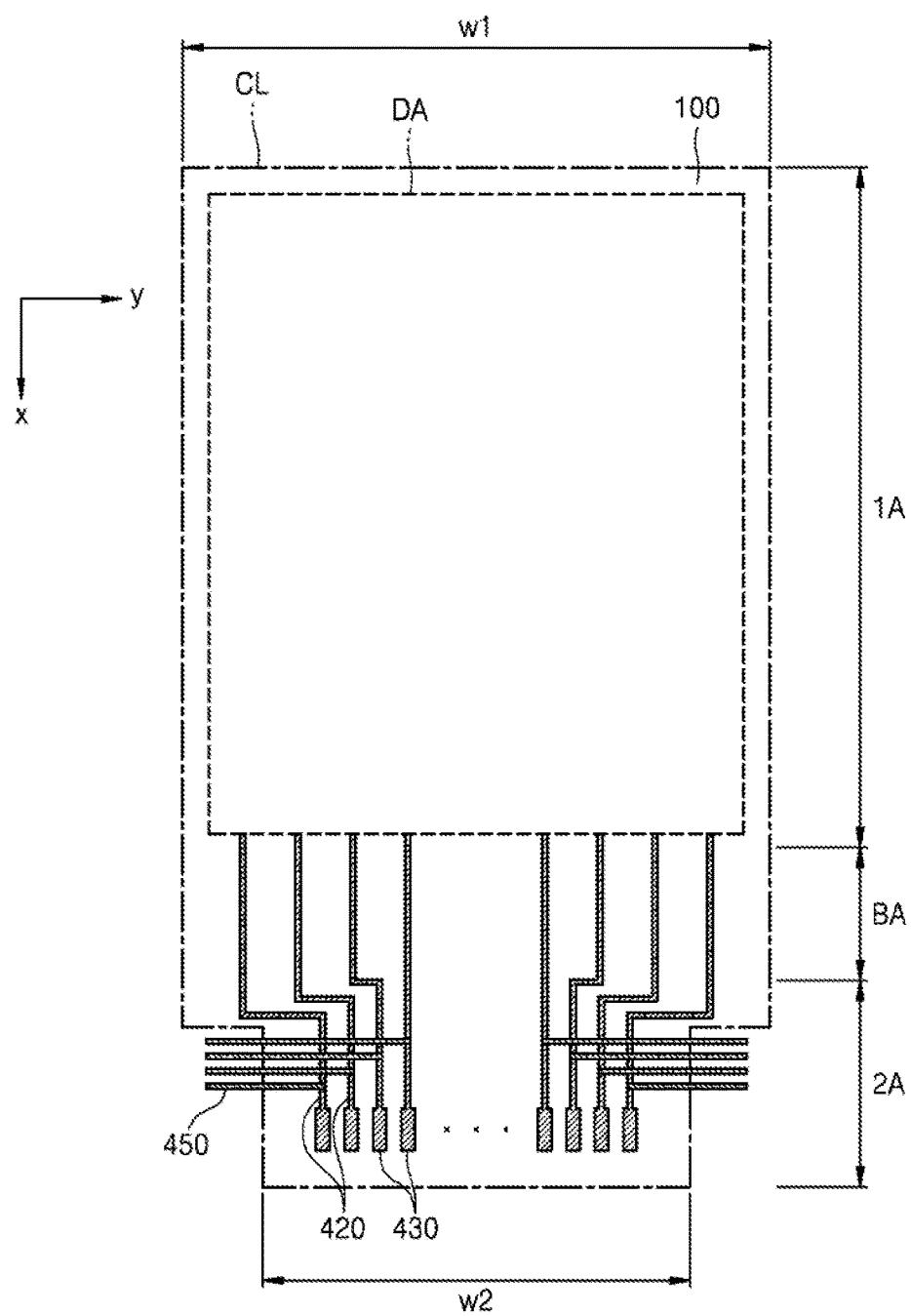
FIG. 8 is a schematic plan view of a part of a display apparatus during a manufacturing process according to an embodiment.
Figure 9:
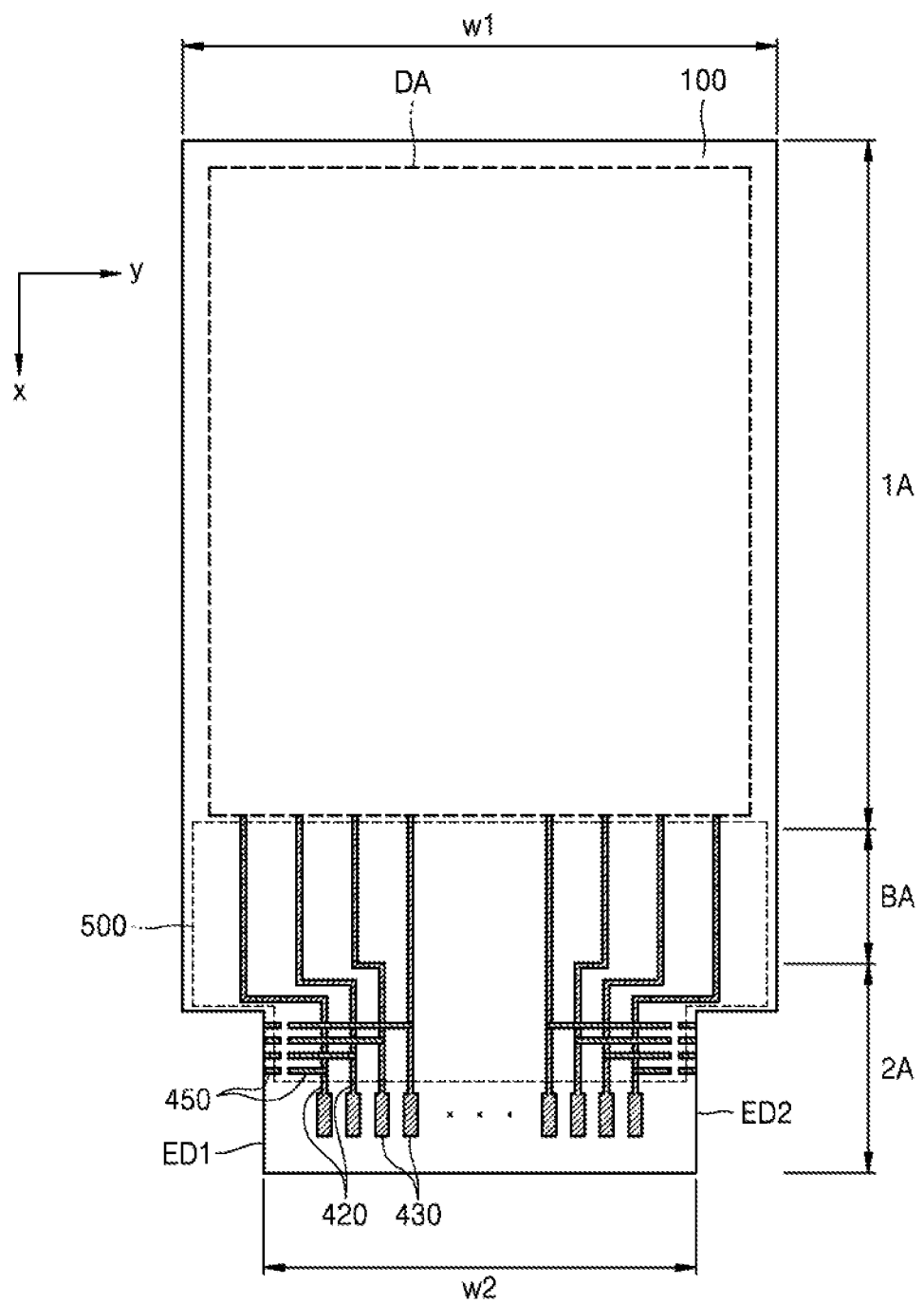
FIG. 9 is a schematic plan view of a part of a display apparatus according to an embodiment.
Figure 10:
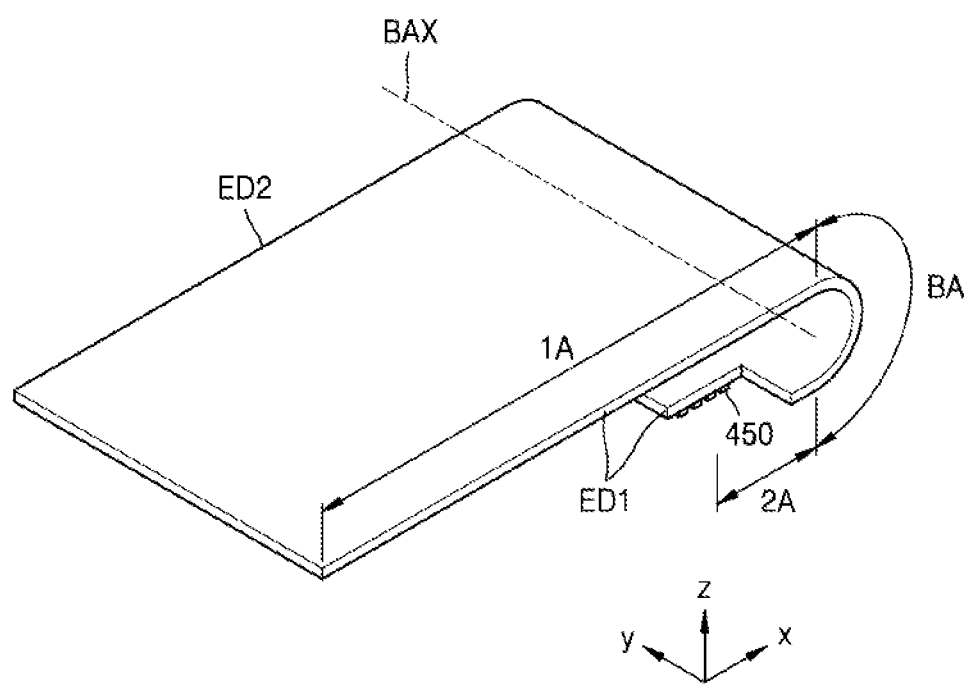
FIG. 10 is a schematic perspective view of a part of a display apparatus according to an embodiment.

FIG. 8 is a schematic plan view of a part of a display apparatus according to an embodiment during a manufacturing process. FIG. 9 is a schematic plan view of a part of a display apparatus after passing through the process of FIG. 8. FIG. 10 is a schematic perspective view of a part of a display apparatus after passing through the process of FIG. 8. In the case of the display apparatus according to the above-described embodiment in FIGS. 4 and. 5, when a plurality of display apparatuses are simultaneously manufactured, an interval between a plurality of display areas DAs (in the y-axis direction) may increase due to the existence of the test wire 450. Accordingly, the number of display apparatuses that may be simultaneously manufactured by using one mother substrate is decreased. However, in the display apparatus, in spite of the existence of the test wire 450, the number of display apparatuses that may be simultaneously manufactured by using one mother substrate may be remarkably increased by decreasing the interval between the display areas DAs (in the y-axis direction) in the manufacturing process.

In detail, in the display apparatus, as illustrated in FIG. 9, with respect to the width of the substrate 100 in a direction (y-axis direction) parallel to the bending axis BAX (see FIG. 1), the second area 2A has a narrow portion. The narrow portion has a second width w2 of the substrate 100 that is narrower than a first width w1 of the substrate 100 in the first area 1A. In addition, the test wire 450 electrically connected to the connection wire 420 extends in the narrow portion to the end surface of the first edge ED1 or the second edge ED2 extending in a direction crossing the bending axis BAX of the substrate 100. An end surface of an end portion of the test wire 450 is flush with the end surface of the first edge ED1 or the second edge ED2 of the substrate 100.

When the display apparatus is manufactured, the display apparatus has a shape in the manufacturing process as illustrated in FIG. 8. It may be understood that the cutting line CL of FIG. 8 is flush with the outer line of the substrate 100 of FIG. 9. In other words, the second width w2 narrower than the first width w1 exists in the width of the cutting line CL in the y-axis direction. As illustrated in FIG. 8, when the display apparatus is manufactured, the test wire 450 does not have the discontinued portion. The test wire 450 has a shape extending by passing the cutting line CL corresponding to the edge of the substrate 100 of the display apparatus later. The test wire 450 passes across a portion corresponding to the cutting line CL having the second width w2. The outermost end of the test wire 450 does not pass across an imaginary extension line from a portion of the cutting line CL having the first width w1. Accordingly, a space between the display areas DAs (in the y-axis direction) may be remarkably reduced.

In the case of the display apparatus, the end surface of the end portion of the test wire 450 exposed to the outside at the first edge ED1 or the second edge ED2 of the substrate 100 is located under the first area 1A of the substrate 100 (see FIG. 6), and when the display apparatus is viewed in a direction (−z direction) in which a viewer watches the display apparatus, the end surface of the end portion of the test wire 450 is located in the inner side of the display apparatus, not in the outermost area of the display apparatus (+x direction). Accordingly, the various elements located above the first area 1A, such as, the TFT, the OLED, the encapsulation layer, the touch electrode, and/or the polarization plate, may effectively shield the test wire 450 located thereunder from external static electricity.

Furthermore, in the display apparatus, the second area 2A of the substrate 100 has a narrow portion having a narrow width of the substrate and the test wire 450 extends in the narrow portion to the end surface of the first edge ED1 or the second edge ED2 extending in a direction crossing the bending axis BAX of the substrate 100. The position of the first edge ED1 or the second edge ED2 in the narrow portion is closer to the center of the first area 1A than the position of the first edge ED1 or the second edge ED2 in the first area 1A, as illustrated in FIG. 10. Accordingly, the end surface of the end portion of the test wire 450 extending to the end of the first edge ED1 or the second edge ED2 in the narrow portion is located in the inner side of the display apparatus, not in the outermost side, in the y-axis direction. Accordingly, the various elements located above the first area 1A, such as, the TFT, the OLED, the encapsulation layer, the touch electrode, and/or the polarization plate, may effectively shield the test wire 450 located thereunder from external static electricity.

Figure 11:
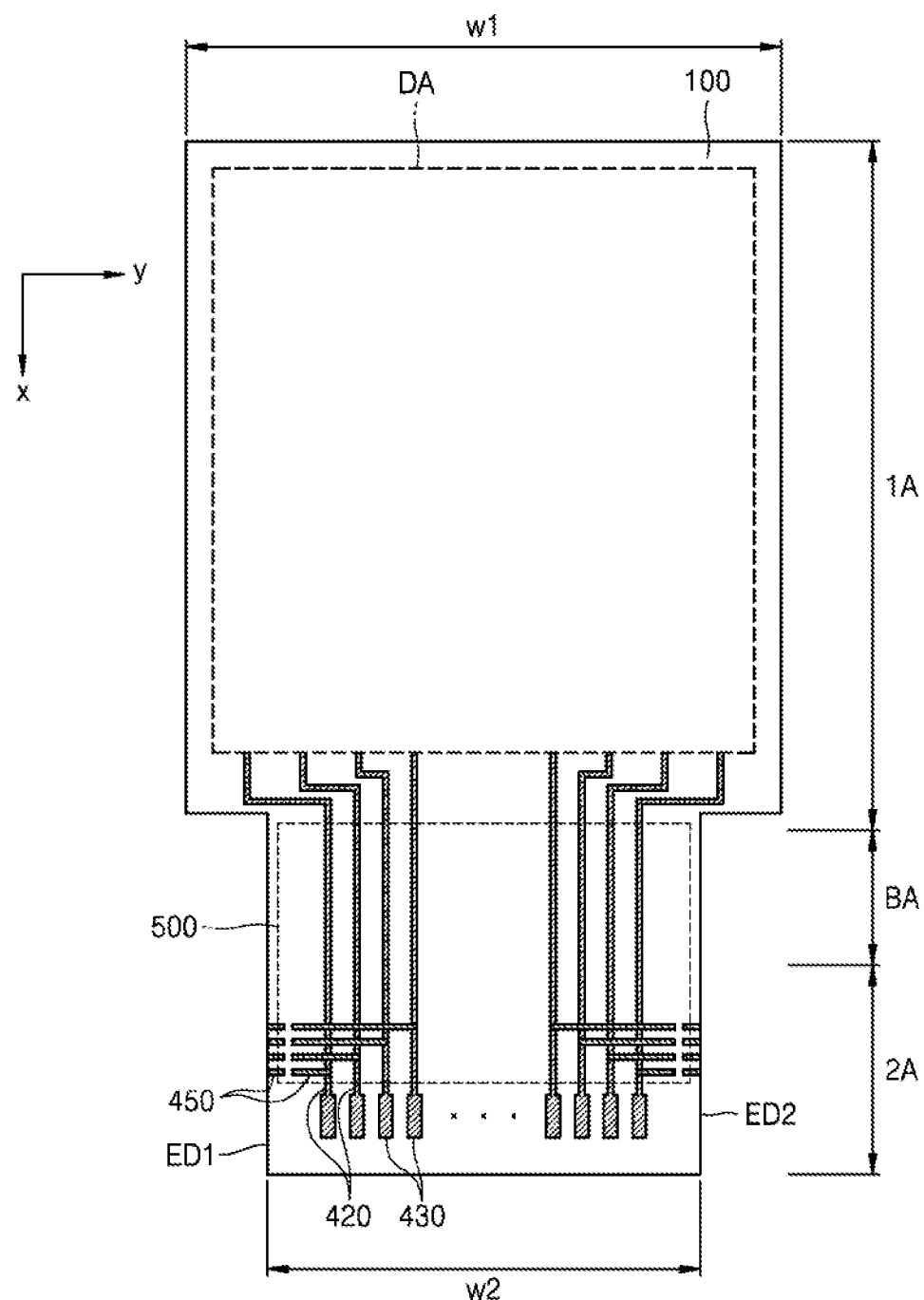
FIG. 11 is a schematic plan view of a part of a display apparatus according to an embodiment.

Not only the second area 2A but also other area may have the narrow portion. As illustrated in FIG. 11, a schematic plan view of a part of a display apparatus according to an embodiment, in addition to the second area 2A, the bent area BA may have a narrow portion having the second width w2 that is narrower than the first width w1 of the substrate 100 in the first area 1A. As described above, the substrate 100 is bent in the bent area BA and the substrate 100 may be easily bent as the width of the substrate 100 in the bent area BA is relatively narrow. Accordingly, as illustrated in FIG. 11, since both of the second area 2A and the bent area BA have the narrow portion, the end surface of the end portion of the test wire 450 is surely protected and also the substrate 100 may be easily bent. All descriptions about the display apparatus described above with reference to FIG. 10 may be applied to the display apparatus according to the embodiment described in FIG. 11.

Figure 12:
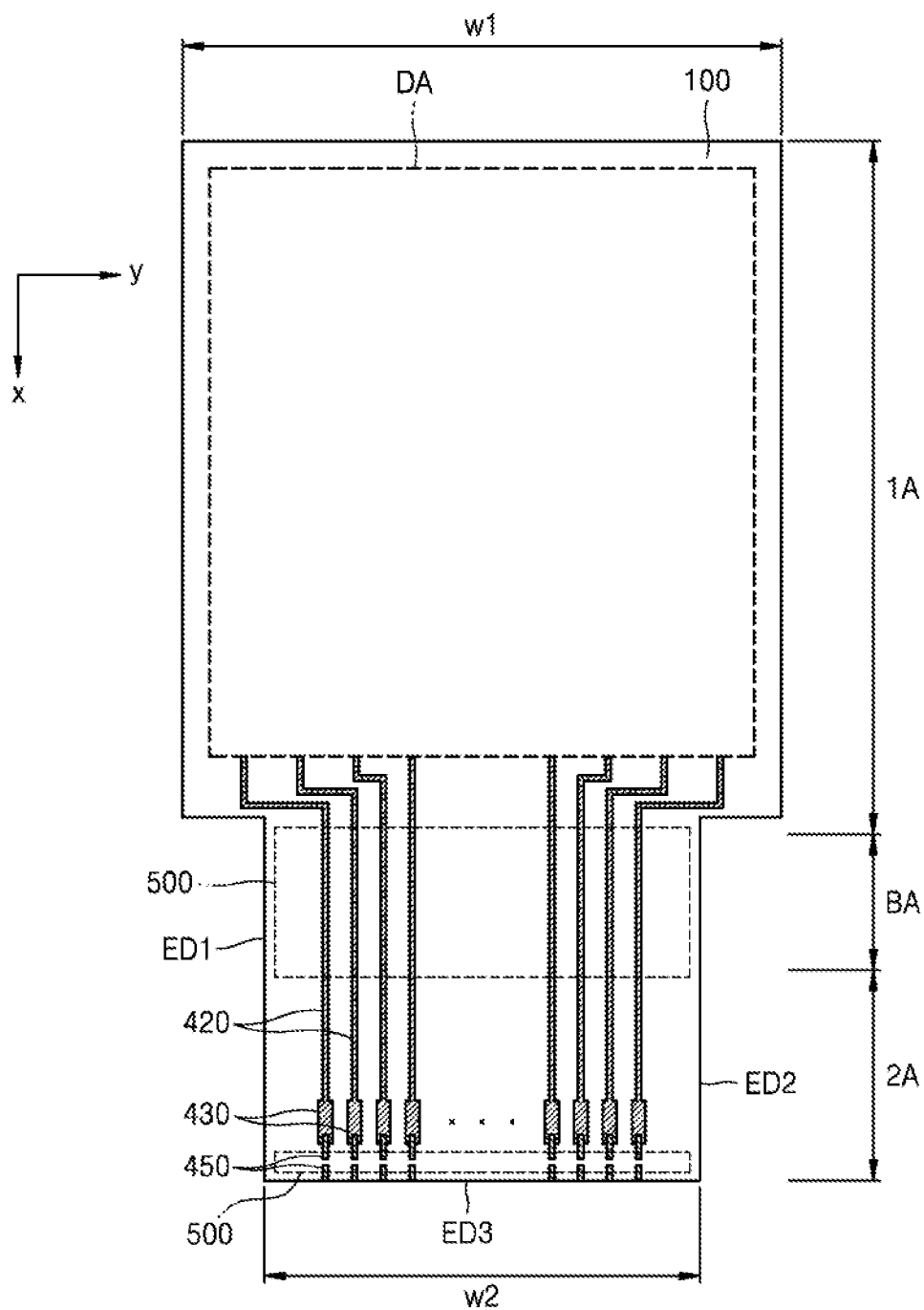
FIG. 12 is a schematic plan view of a part of a display apparatus according to an embodiment.

Although FIGS. 10 and 11 illustrate a case in which the test wire 450 is connected to the connection wire 420, the present disclosure is not limited thereto. For example, as illustrated in FIG. 12, a schematic plan view of a part of a display apparatus according to an embodiment, the test wire 450 may be electrically connected to the pad 430. In FIG. 12, the pad 430 is simultaneously formed of the same material as the gate electrode G of the TFT and the test wire 450 is simultaneously formed of the same material as the source electrode S and the drain electrode D of the TFT, and part of the test wire 450 is located above the pad 430 so that the test wire 450 is electrically connected to the pad 430 through the contact hole in the insulating layer located between the test wire 450 and the pad 430. In contrast, the test wire 450 is simultaneously formed of the same material as the gate electrode G of the TFT and the pad 430 is simultaneously formed of the same material as the source electrode S and the drain electrode D of the TFT, or various modifications thereof are possible. In embodiments, when the test wire 450 is electrically connected to the pad 430, the test wire 450 may extend to the end of the third edge ED3 extending in a direction parallel to the bending axis BAX (see FIG. 1) of the substrate 100.

In the case of the display apparatus, the test wire 450 has the discontinued portion between the pad 430 and the third edge ED3 of the substrate 100, the portion located at the third edge ED3 of the substrate 100 and the portion connected to the pad 430 may be physically separated from each other. Accordingly, even when the portion of the test wire 450 located at the third edge ED3 of the substrate 100 is damaged, the portion of the test wire 450 connected to the pad 430 that is physically separated from the portion of the test wire 450 located at the third edge ED3 of the substrate 100 is not damaged. Also, even when an unintended electrically signal is applied to the portion of the test wire 450 located at the third edge ED3 of the substrate 100, the electrical signal is not transferred to the portion of the test wire 450 connected to the pad 430. Accordingly, the pad 430, the connection wire 420, and/or the various elements in the display area DA may be effectively prevented from being damaged or malfunctioning.

In particular, referring to FIG. 10, when the display apparatus is viewed in a direction (−z direction) in which a viewer watches the display apparatus, the third edge ED3 of the substrate 100 is located in a direction toward the inside of the display apparatus to be spaced farthest from the edge (+x direction). Accordingly, in the case of the display apparatus, since the end surface of the end portion of the test wire 450 exposed to the outside from the third edge ED3 of the substrate 100 is located in the innermost area of the display apparatus, the test wire 450 may be effectively shielded from external static electricity. In addition, as the bent area BA has the narrow portion, the end surface of the end portion of the test wire 450 is surely protected, and also, the substrate 100 may be easily bent. Unlike FIG. 12, the bent area BA does not have the narrow portion and only the second area 2A has the narrow portion.

Although in the above description the display area DA is located in the first area 1A only, the present disclosure is not limited thereto. For example, as illustrated in FIG. 13A, a schematic plan view of a part of a display apparatus according to an embodiment, the display area DA may extend to at least part of the bent area BA. Although FIG. 13A illustrates a modified embodiment of the display apparatus according to the embodiment of FIG. 4A, the present disclosure is not limited thereto. Even in the display apparatuses described above with reference to FIG. 7A and/or FIG. 9, the display area DA may extend to at least part of the bent area BA or various modifications thereof are possible. For reference, when the display area DA extends to the bent area BA as illustrated in FIG. 13A, the display apparatus may include the insulating layer 500 that covers only the discontinued portion of the test wire 450. In FIG. 13A, the insulating layer 500 is located at the lower left and lower right corners of the display apparatus.

As can be appreciated from the above-described embodiments, potential defect in a display device may be prevented.

It should be understood that embodiments described herein should be considered in a descriptive sense and not for purposes of limitation. Descriptions of features or aspects within each embodiment should typically be considered as available for similar features or aspects in other embodiments.

While embodiments have been described with reference to the figures, it will be understood by those of ordinary skill in the art that various changes in form and details may be made therein without departing from the spirit and scope defined by the following claims.

What is claimed is:

1. A display apparatus comprising:
   a substrate comprising a first portion, a second portion, and a bent portion, wherein the first portion is connected through the bent portion to the second portion;
   a display portion positioned on the first portion;
   a pad positioned on the second portion;
   a connection wire electrically connected to the pad and extending to the bent portion; and
   a conductive wire including a first section and a second section,
   the first section of the conductive wire being formed of a first material and ending at an edge of the substrate, the first section of the conductive wire being electrically insulated from the pad,
   the second section of the conductive wire being formed of the first material, aligned with and electrically insulated from the first section of the conductive wire, and electrically connected to the connection wire.

2. The display apparatus of claim 1, wherein the first portion is positioned over the second portion, and wherein both the first section of the conductive wire and the second section of the conductive wire are positioned on the second portion.

3. The display apparatus of claim 1 comprising: an insulating layer overlapping a surface of the substrate, wherein a portion of the insulating layer is positioned between an end surface of the first section of the conductive wire and an end surface of the second section of the conductive wire and directly contacts both the end surface of the first section of the conductive wire and the end surface of the second section of the conductive wire, wherein the end surface of the first section of the conductive wire and the end surface of the second section of the conductive wire face each other, wherein each of the end surface of the first section of the conductive wire and the end surface of the second section of the conductive wire is not parallel to the surface of the substrate.

4. The display apparatus of claim 3, wherein the portion of the insulating layer protrudes perpendicular to the surface of the substrate.

5. The display apparatus of claim 3, wherein the insulating layer overlaps each of the connection wire, the first section of the conductive wire, and the second section of the conductive wire.

6. The display apparatus of claim 3, wherein a first edge of the insulating layer intersects the first section of the conductive wire.

7. The display apparatus of claim 6, wherein a second edge of the insulating layer intersects the second section of the conductive wire.

8. The display apparatus of claim 7, wherein the first edge of the insulating layer and the second edge of the insulating layer are positioned between the edge of the substrate and the connection wire.

9. The display apparatus of claim 8 comprising: a pad, wherein the second section of the conductive wire is electrically connected through the pad to the connection wire, wherein the first edge of the insulating layer and the second edge of the insulating layer are positioned between the edge of the substrate and the pad.

10. The display apparatus of claim 7, wherein each of the first section of the conductive wire and the second section of the conductive wire is aligned with the connection wire.

11. The display apparatus of claim 6, wherein a second edge of the insulating layer intersects the connection wire.

12. The display apparatus of claim 11, wherein a third edge of the insulating layer intersects the connection wire.

13. The display apparatus of claim 6, wherein the first edge of the insulating layer extends parallel to the connection wire and is shorter than the connection wire.

14. The display apparatus of claim 3, wherein the portion of the insulating layer is positioned on the second portion of the substrate.

15. The display apparatus of claim 3, wherein a portion of the second portion of the substrate is positioned between the first portion of the substrate and the portion of the insulating layer.

16. The display apparatus of claim 1, wherein the first section of the conductive wire is aligned with the second section of the conductive wire in a first direction and is positioned on the second portion, and wherein at least one of the second portion and the bent portion is narrower than the first portion in the first direction.

17. The display apparatus of claim 16, wherein the second portion is narrower than the bent portion in the first direction.

18. The display apparatus of claim 3, wherein each of the first section of the conductive wire and the second section of the conductive wire is aligned with the connection wire in a first direction, and wherein the second portion is connected to the bent portion in the first direction.

19. The display apparatus of claim 18, wherein the portion of the insulating layer is positioned on the second portion of the substrate, wherein the second portion of the substrate is narrower than the first portion of the substrate in a second direction, and wherein the second direction is perpendicular to the first direction.

20. A display apparatus comprising:
   a substrate comprising a first portion, a second portion, and a bent portion, wherein the first portion is connected through the bent portion to the second portion;
   a display portion positioned on the first portion;
   a pad positioned on the second portion;
   a connection wire electrically connected to the pad and extending to the bent portion; and
   a conductive wire including a first section and a second section,
   the first section of the conductive wire being formed of a first material, overlapping a surface of the substrate, having a first end surface, and being electrically insulated from the pad, wherein the first end surface is not parallel to the surface of the substrate,
   the second section of the conductive wire being formed of the first material, electrically insulated from the first section of the conductive wire, electrically connected to the connection wire, and having a second end surface, wherein the second end surface is not parallel to the surface of the substrate, wherein the first end surface and the second end surface face each other, and wherein a shape of the second end surface is a mirror image of a shape of the first end surface.

* * * * *